US012137518B2

(12) United States Patent
Farkas et al.

(10) Patent No.: US 12,137,518 B2
(45) Date of Patent: Nov. 5, 2024

(54) RESETTING DIFFERENT PAIR SKEW OF PRINTED CIRCUIT BOARD TRACES

(71) Applicant: DELL PRODUCTS L.P., Round Rock, TX (US)

(72) Inventors: Sandor Farkas, Round Rock, TX (US); Bhyrav Mutnury, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 205 days.

(21) Appl. No.: 17/726,189

(22) Filed: Apr. 21, 2022

(65) Prior Publication Data
US 2023/0345626 A1    Oct. 26, 2023

(51) Int. Cl.
*H05K 1/02* (2006.01)

(52) U.S. Cl.
CPC ......... *H05K 1/0248* (2013.01); *H05K 1/0218* (2013.01); *H05K 1/0228* (2013.01); *H05K 1/0245* (2013.01); *H05K 2201/09227* (2013.01)

(58) Field of Classification Search
CPC .. H05K 1/0248; H05K 1/0218; H05K 1/0228; H05K 1/0245; H05K 2201/09218
See application file for complete search history.

(56) References Cited

U.S. PATENT DOCUMENTS

| | | | |
|---|---|---|---|
| 2003/0123236 A1* | 7/2003 | McGrath | H01R 13/6585 361/760 |
| 2004/0037050 A1* | 2/2004 | Nakayama | H05K 1/0219 361/736 |
| 2009/0188711 A1* | 7/2009 | Ahmad | H05K 1/0248 174/262 |
| 2013/0175078 A1* | 7/2013 | Pai | H05K 1/0222 174/264 |
| 2014/0002935 A1* | 1/2014 | Chen | H05K 1/18 361/728 |
| 2019/0200449 A1* | 6/2019 | Toda | H05K 1/0222 |
| 2019/0297721 A1 | 9/2019 | Chandra et al. | |
| 2020/0253036 A1 | 8/2020 | Chandra et al. | |

* cited by examiner

*Primary Examiner* — Hoa C Nguyen
(74) *Attorney, Agent, or Firm* — Larson Newman, LLP

(57) ABSTRACT

An information handling system includes a printed circuit board, which in turn includes a differential pair, a ground trace, and a ground via. The differential pair includes first and second traces. The ground trace is routed between the first and second traces of the differential pair. The ground via is located along the ground trace. The ground trace and the ground via combine to create a common mode signal filter, which in turn resets a skew of the differential pair.

17 Claims, 7 Drawing Sheets

RESETTING DIFFERENT PAIR SKEW OF PRINTED CIRCUIT BOARD TRACES

FIELD OF THE DISCLOSURE

The present disclosure generally relates to information handling systems, and more particularly relates to resetting different pair skew of printed circuit board traces.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An information handling system includes a printed circuit board, which in turn includes a differential pair, a ground trace, and a ground via. The differential pair includes first and second traces. The ground trace is routed between the first and second traces of the differential pair. The ground via is located along the ground trace. The ground trace and the ground via combine to create a common mode signal filter, which in turn resets a skew of the differential pair.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
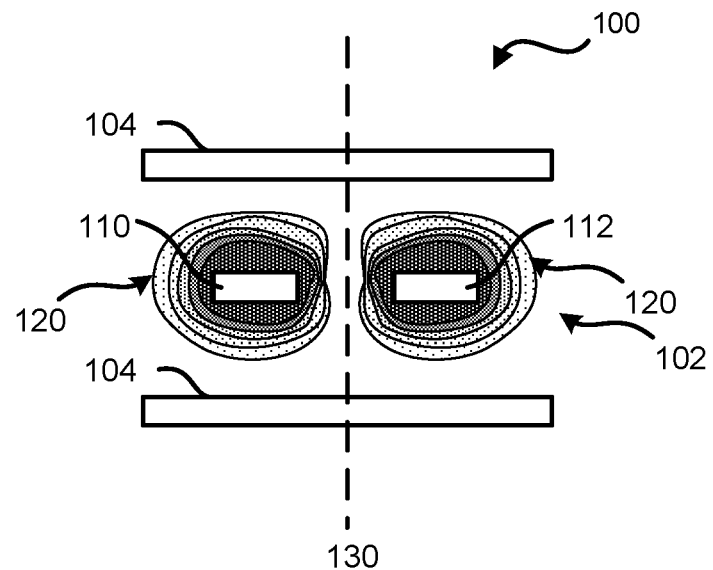
FIGS. 1 and 2 are diagrams of a cross section of a differential pair and ground layers within a printed circuit board according to at least one embodiment of the present disclosure.
Figure 2:
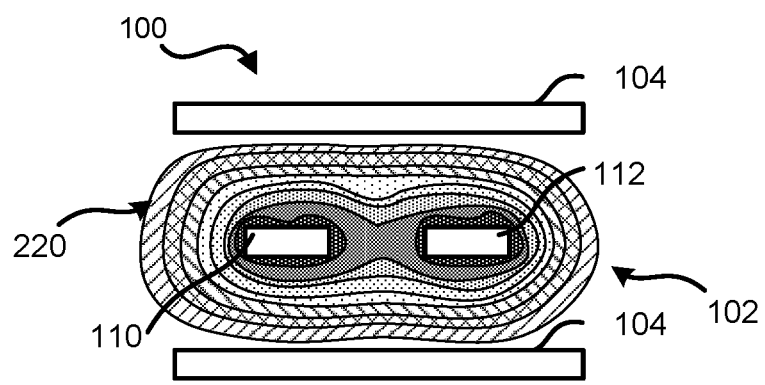
Figure 9:
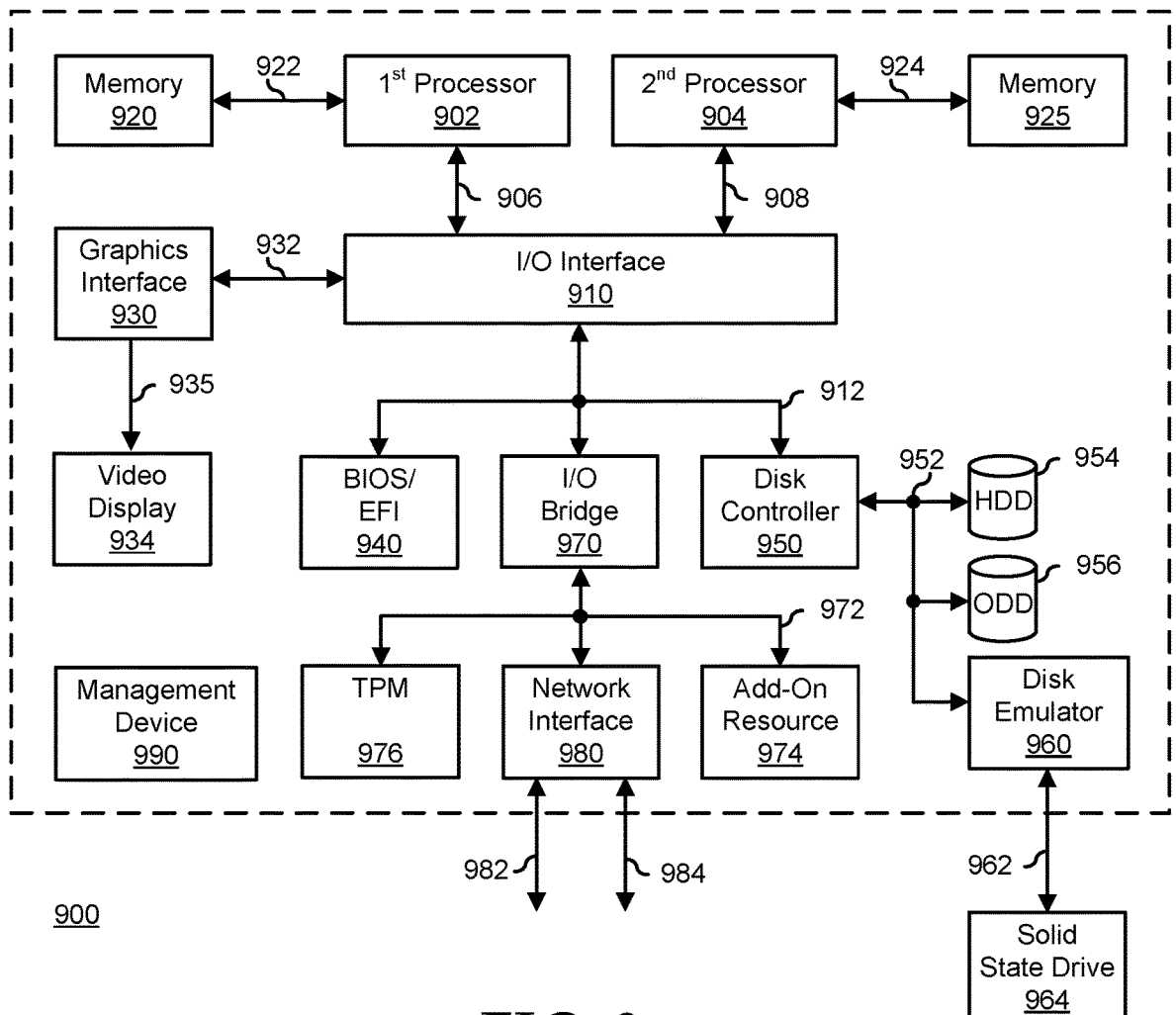
FIG. 9 is a block diagram of a general information handling system according to an embodiment of the present disclosure.

FIGS. 1 and 2 illustrate a cross section of a printed circuit board (PCB) 100 of an information handling system, such as information handling system 900 of FIG. 9, according to at least one embodiment of the present disclosure. For purpose of this disclosure information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system can be a personal computer, a laptop computer, a smart phone, a tablet device or other consumer electronic device, a network server, a network storage device, a switch, a router, or another network communication device, or any other suitable device and may vary in size, shape, performance, functionality, and price.

PCB 100 includes a differential pair 102 and ground plane layers 104. Differential pair 102 includes traces 110 and 112. Differential pair 102 may be created, formed, routed, or the like on PCB 100 to include symmetry between traces 110 and 112. In an example, one of traces 110 and 112 may be the positive trace and the other trace may be the negative trace for transmitting a differential signal along the differential pair.

Referring now to FIG. 1, based on symmetrical geometry of differential pair 102, a centerline 130 of the differential pair may act or behave as a virtual ground extending from one of ground plane layers 104 to the other. In an example, traces 110 and 112 may be designed to have substantially similar impedances $Z_0$. In this example, if the impedances of traces 110 and 112 are substantially similar, electric fields 120 produced by the signals on the traces may not interfere or overlap during differential mode signaling as shown in FIG. 1. In certain examples, the virtual ground extending along centerline 130 may prevent overlap or interference between the electric fields 120 of traces 110 and 112.

Referring now to FIG. 2, electrical fields 220 from traces 110 and 112 may be affected by a skew during common mode signaling. For example, electrical fields 220 may interfere and overlap from trace 110 to trace 112, and this overlap may lower or destroy signal integrity (SI) performance of differential pair 102. The common mode signaling on traces 110 and 112 may be caused by skew of differential pair 102. As used herein, skew refers to a time different between the signals provide on traces 110 and 112 of differential pair 102. In an example, while differential pair 102 may have good signal performance, the differential pair may be sensitive to skew. Differential pair 102 may be affected by different types of skew, and the different types of skew may be caused one more characteristics of traces 110 and 112 of the differential pair.

Skew may be caused one or more characteristics of differential pair 102. For example, the different types of skew may include, but is not limited to, a deterministic skew and a random skew. In an example, deterministic skew may be caused based on a length mismatch between traces 110 and 112 created by routing bends in the traces, a PCB fiber weave, or the like. In this example, deterministic skew may be corrected by adding length to traces 110 and 112 in the PCB layout. In certain examples, the PCB fiber weave may be worked around by zigzag routing, panel rotation, or the like.

In an example, random skew may be caused based on proximity of traces 110 and 112 to voids with registration tolerances, crosstalk/noise, skewed silicon, or the like. Random skew may a cause a large problem to SI performance. However, previous PCB routing techniques do not have a solution to compensate for random skew. In an example, random skew may also originate from uncontrollable parameters such as a dielectric constant variation in PCB 100. The random skew may reduce differential signal bandwidth and create a common mode signal component that may radiate or overwhelm a receiver of differential pair 102. For example, 10 ps skew may destroy SI performance for high speed signals greater than 25 Gbps. In an example, skew may have a fixed delay, such that the skew exhibits a periodic insertion loss. For example, the frequency of the periodic insertion loss is based on the delay caused by the skew.

In previous information handling systems, a common mode choke (CMC) may be utilized to reduce common model signals on cables. A CMC may eliminate the periodic insertion loss caused by the skew of differential pair 102. In an example, an ideal CMC may have a low attenuation of differential signals and a large attenuation of common mode signals over a wide frequency range. In previous PCBs of information handling systems, a CMC may be implemented as a transformer. However, a transformer may not be a practical embodiment for dense PCB designs. In an example, a circuit with different filtering characteristics on common mode versus differential signals may improve or eliminate skew impacts on signals in differential pair 102.

Figure 3:
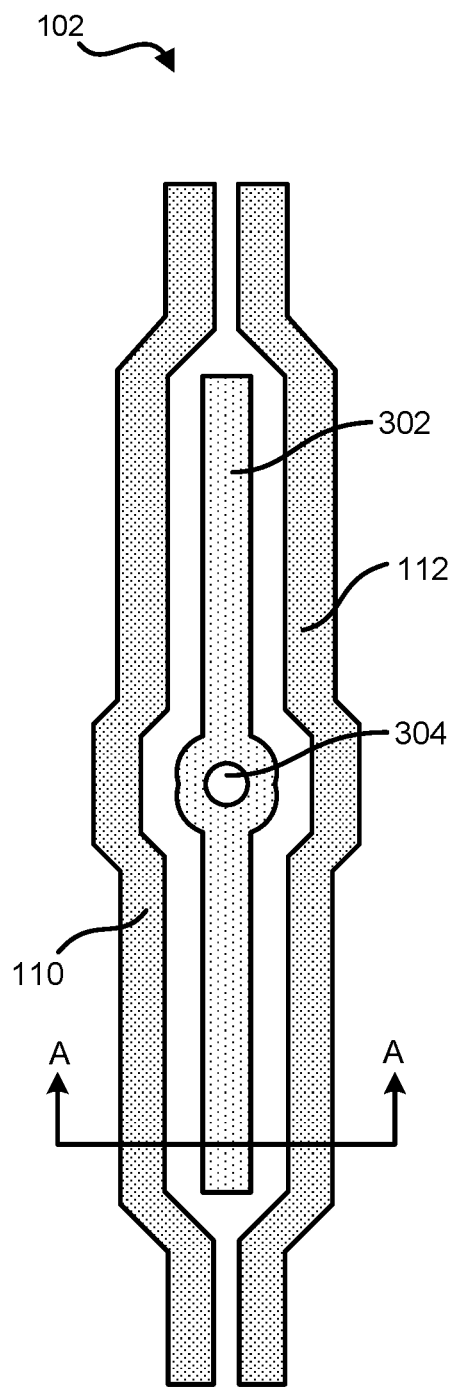
FIG. 3 is a diagram of the differential pair with a ground trace between the traces of the differential pair according to at least one embodiment of the present disclosure.

FIG. 3 illustrates differential pair 102 with a ground trace 302 between traces 110 and 112 of the differential pair according to at least one embodiment of the present disclosure. Ground trace 302 may be routed along the line of symmetry between traces 110 and 112 of differential pair 102, and the ground trace may work in a substantially similar way to a CMC. While ground trace 302 is illustrated as a single ground trace with ground via 304 in the middle of the ground trace, the ground trace may be two separate ground traces with different lengths without varying from the scope of this disclosure.

In an example, the ends of ground trace 302 may be left floating, and traces 110 and 112 of differential pair 102 may closely follow the ground trace and ground via 304. The trace widths and spacing of traces 110 and 112 may be designed to maintain constant impedance over the entire length of differential pair 102. For example, the center frequency may be tuned to a frequency of interest by adjusting the length of ground trace 302 on either or both sides of ground via 304. In an example, ground trace 302 may have a length of 2.8 mm to optimize the filter created from the ground trace and ground via 304 for a PCIE Generation 5 signal with a frequency centered at 16 GHz. In certain examples, the filter created from ground trace 302 and ground via 304 may be placed near an end of a source to zero out transmission silicon skew. While a single filter of ground trace 302 and ground via 304 is illustrated in FIG. 3, multiple filters may be used to zero out fiber weave, noise or void proximity effects along an entire channel and to reset skew periodically.

Figure 4:
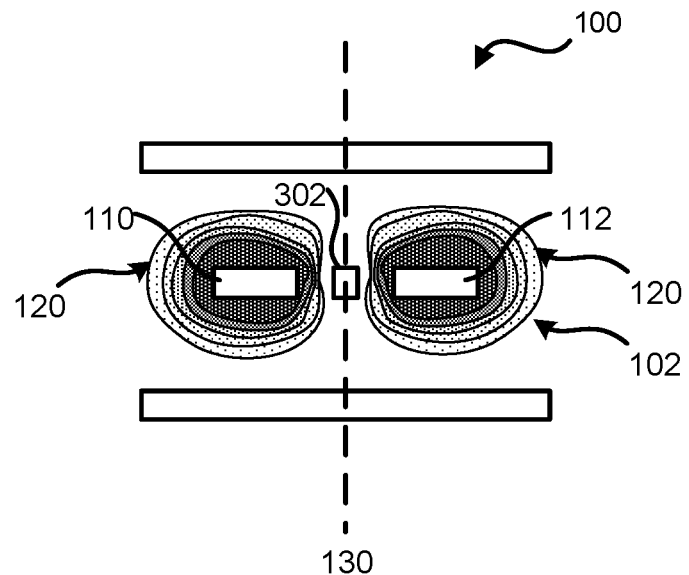
FIGS. 4 and 5 are diagrams of a cross section of the differential pair with the ground trace between the traces of the differential pair according to at least one embodiment of the present disclosure.
Figure 5:
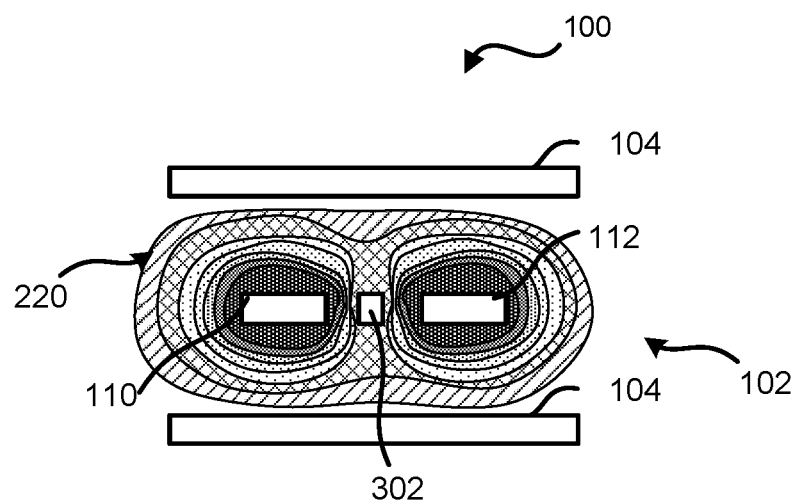

FIGS. 4 and 5 illustrate cross sections of PCB 100 taken along line A-A of FIG. 3. PCB 100 includes differential pair 102 with ground trace 302 between traces 110 and 112 of the differential pair according to at least one embodiment of the present disclosure. As shown in FIG. 4, electrical fields 120 of the differential mode signals on traces 110 and 112 are substantially similar to electrical fields 120 in FIG. 1. Thus, ground trace 302 does not significantly impact the differential signals as long as the impedances of traces 110 and 112 are maintained.

As shown in FIG. 5, electrical fields 220 of the common mode signals on traces 110 and 112 are substantially different from electrical fields 220 in FIG. 2. In an example, the common mode signals may experience a big change, based on ground trace 302 providing a new reference plane between traces 110 and 112 of differential pair 102. In this example, the new reference plane from ground trace 302 may impact the capacitance and inductance of differential pair 102, which in turn may impact the impedance of the differential pair. In an example, the topology of ground trace 302 may operate as a filter for common mode signals on traces 110 and 112 of differential pair 102, but does not impact differential signals on the traces of the differential pair.

Figure 6:
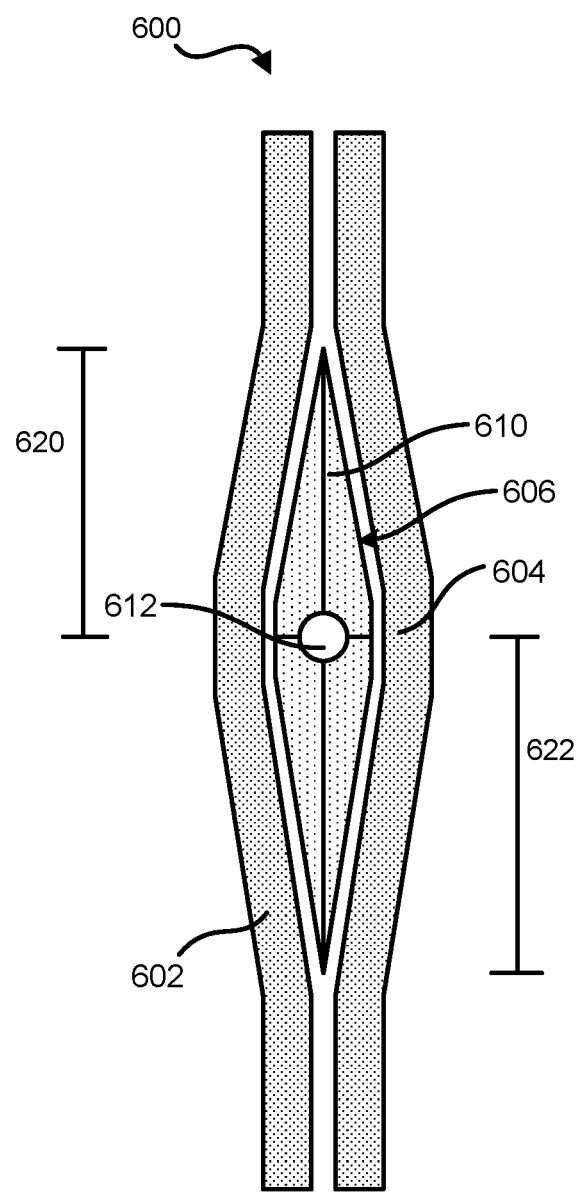
FIG. 6 is a diagram of another differential pair with a ground trace between the traces of the differential pair according to at least one embodiment of the present disclosure.

FIG. 6 illustrates differential pair 600 including traces 602 and 604 according to at least one embodiment of the present disclosure. Differential pair 600 may include a ground trace or shape 610 with a ground via 612 within the ground shape. In an example, ground shape 610 may extend different lengths on either side of ground via 612. For example, a first side of ground shape 610 may extend a first length 620 from ground via 612, and a second side of the ground shape may extend a second length 622 from the ground via.

In an example, lengths 620 and 622 of ground shape 610 may utilized or designed to set a center frequency for the filter created by the ground shape and ground via 612. For example, the center frequency may be tuned to a frequency of interest by adjusting lengths 620 and 622 of ground shape 610. Lengths 620 and 622 of ground shape 610 do not have to be the same. For example, if lengths 620 and 622 are slightly offset, the filter may have a wider band response by adding a second pole.

Ground shape 610 may be any suitable shape including, but not limited to, a kite shape, a rectangle shape, and an oval shape. The kite shape of ground shape 610 may be any suitable design, such as a triangle shape of both sides of ground via 612 as shown in FIG. 6. In an example, the kite shape, shown in FIG. 6, may result in a gradual impedance change along traces 602 and 604. Traces 602 and 604 may be routed within a PCB to follow the shape of ground shape 610. In certain examples, the characteristics of traces 602 and 604, such as trace width and distance from ground shape 610, may be varied to further change the impact on the skew of differential pair 600.

Figure 7:
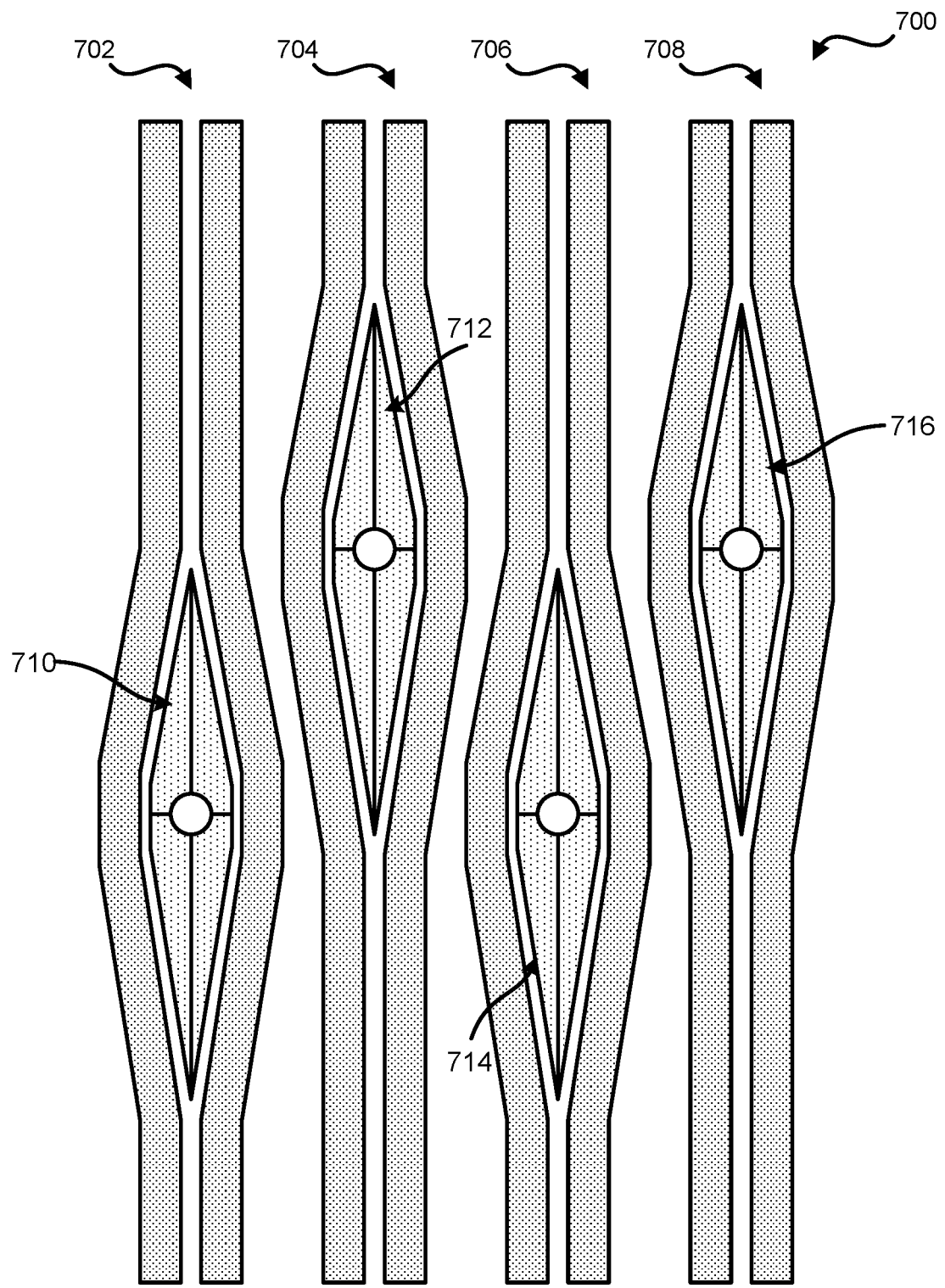
FIG. 7 is a diagram of a printed circuit board with multiple differential pairs and offset ground traces according to at least one embodiment of the present disclosure.

FIG. 7 illustrates a PCB 700 with multiple differential pairs 702, 704, 706, and 708 according to at least one embodiment of the present disclosure. Each differential pair 702, 704, 706, and 708 includes a respective common mode filter 710, 712, 714, and 716. In an example, each common mode filter 710, 712, 714, and 716 may include a respective ground shape and a respective ground via as described above with respect to FIG. 6. As shown in FIG. 7, filters 710, 712, 714, and 716 may be staggered on adjacent pairs 702 and 704, 704 and 706, and 706 and 708 to maximize bus layout density in PCB 700.

Figure 8:
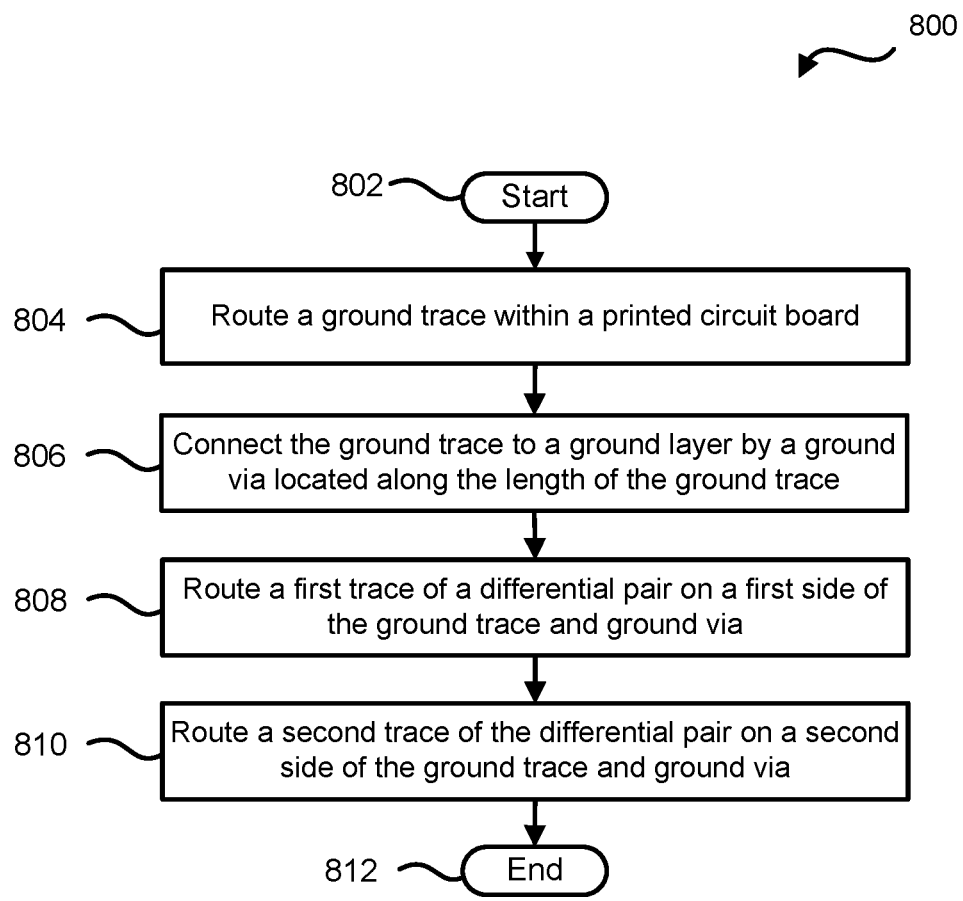
FIG. 8 is a flow diagram of method for resetting a differential pair skew of printed circuit board traces according to at least one embodiment of the present disclosure.

FIG. 8 is a flow diagram of method 800 for resetting a differential pair skew of printed circuit board traces according to at least one embodiment of the present disclosure, starting a block 802. It will be readily appreciated that not every method step set forth in this flow diagram is always necessary, and that certain steps of the methods may be combined, performed simultaneously, in a different order, or perhaps omitted, without varying from the scope of the disclosure.

At block 804, a ground trace is routing within a PCB. At block 806, the ground trace is connected to a ground layer by a ground via located along the length of the ground trace. At block 808, a first trace of a differential pair is routed on a first side of the ground trace and the ground via. At block 810, a second trace of the differential pair is routed on a second side of the ground trace and the ground via, and the flow ends at block 812.

FIG. 9 illustrates a generalized embodiment of an information handling system 900. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 900 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 900 can include processing resources for executing machine-executable code, such as a central processing unit (CPU), a programmable logic array (PLA), an embedded device such as a System-on-a-Chip (SoC), or other control logic hardware. Information handling system 900 can also include one or more computer-readable medium for storing machine-executable code, such as software or data. Additional components of information handling system 900 can include one or more storage devices that can store machine-executable code, one or more communications ports for communicating with external devices, and various input and output (I/O) devices, such as a keyboard, a mouse, and a video display. Information handling system 900 can also include one or more buses operable to transmit information between the various hardware components.

Information handling system 900 can include devices or modules that embody one or more of the devices or modules described below, and operates to perform one or more of the methods described below. Information handling system 900 includes a processors 902 and 904, an input/output (I/O) interface 910, memories 920 and 925, a graphics interface 930, a basic input and output system/universal extensible firmware interface (BIOS/UEFI) module 940, a disk controller 950, a hard disk drive (HDD) 954, an optical disk drive (ODD) 956, a disk emulator 960 connected to an external solid state drive (SSD) 962, an I/O bridge 970, one or more add-on resources 974, a trusted platform module (TPM) 976, a network interface 980, a management device 990, and a power supply 995. Processors 902 and 904, I/O interface 910, memory 920, graphics interface 930, BIOS/UEFI module 940, disk controller 950, HDD 954, ODD 956, disk emulator 960, SSD 962, I/O bridge 970, add-on resources 974, TPM 976, and network interface 980 operate together to provide a host environment of information handling system 900 that operates to provide the data processing functionality of the information handling system. The host environment operates to execute machine-executable code, including platform BIOS/UEFI code, device firmware, operating system code, applications, programs, and the like, to perform the data processing tasks associated with information handling system 900.

In the host environment, processor 902 is connected to I/O interface 910 via processor interface 906, and processor 904 is connected to the I/O interface via processor interface 908. Memory 920 is connected to processor 902 via a memory interface 922. Memory 925 is connected to processor 904 via a memory interface 927. Graphics interface 930 is connected to I/O interface 910 via a graphics interface 932, and provides a video display output 936 to a video display 934. In a particular embodiment, information handling system 900 includes separate memories that are dedicated to each of processors 902 and 904 via separate memory interfaces. An example of memories 920 and 930 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 940, disk controller 950, and I/O bridge 970 are connected to I/O interface 910 via an I/O channel 912. An example of I/O channel 912 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 910 can also include one or more other I/O interfaces, including an Industry Standard Architecture (ISA) interface, a Small Computer Serial Interface (SCSI) interface, an Inter-Integrated Circuit (I2C) interface, a System Packet Interface (SPI), a Universal Serial Bus (USB), another interface, or a combination thereof. BIOS/UEFI module 940 includes BIOS/UEFI code operable to detect resources within information handling system 900, to provide drivers for the resources, initialize the resources, and access the resources. BIOS/UEFI module 940 includes code that operates to detect resources within information handling system 900, to provide drivers for the resources, to initialize the resources, and to access the resources.

Disk controller 950 includes a disk interface 952 that connects the disk controller to HDD 954, to ODD 956, and to disk emulator 960. An example of disk interface 952 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 960 permits SSD 964 to be connected to information handling system 900 via an external interface 962. An example of external interface 962 includes a USB interface, an IEEE 1394 (Firewire) interface, a proprietary interface, or a combination thereof. Alternatively, solid-state drive 964 can be disposed within information handling system 900.

I/O bridge 970 includes a peripheral interface 972 that connects the I/O bridge to add-on resource 974, to TPM 976, and to network interface 980. Peripheral interface 972 can be the same type of interface as I/O channel 912, or can be a different type of interface. As such, I/O bridge 970 extends the capacity of I/O channel 912 when peripheral interface 972 and the I/O channel are of the same type, and the I/O bridge translates information from a format suitable to the I/O channel to a format suitable to the peripheral channel 972 when they are of a different type. Add-on resource 974 can include a data storage system, an additional graphics interface, a network interface card (NIC), a sound/video processing card, another add-on resource, or a combination thereof. Add-on resource 974 can be on a main circuit board, on separate circuit board or add-in card disposed within information handling system 900, a device that is external to the information handling system, or a combination thereof.

Network interface 980 represents a NIC disposed within information handling system 900, on a main circuit board of the information handling system, integrated onto another component such as I/O interface 910, in another suitable location, or a combination thereof. Network interface device 980 includes network channels 982 and 984 that provide interfaces to devices that are external to information handling system 900. In a particular embodiment, network channels 982 and 984 are of a different type than peripheral channel 972 and network interface 980 translates information from a format suitable to the peripheral channel to a format suitable to external devices. An example of network channels 982 and 984 includes InfiniBand channels, Fibre Channel channels, Gigabit Ethernet channels, proprietary channel architectures, or a combination thereof. Network channels 982 and 984 can be connected to external network resources (not illustrated). The network resource can include another information handling system, a data storage system, another network, a grid management system, another suitable resource, or a combination thereof.

Management device 990 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 900. In particular, management device 990 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 900, such as system cooling fans and power supplies. Management device 990 can include a network connection to an external management system, and the management device can communicate with the management system to report status information for information handling system 900, to receive BIOS/UEFI or system firmware updates, or to perform other task for managing and controlling the operation of information handling system 900. Management device 990 can operate off of a separate power plane from the components of the host environment so that the management device receives power to manage information handling system 900 when the information handling system is otherwise shut down. An example of management device 990 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 990 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A printed circuit board of an information handling system, the printed circuit board comprising:
    a differential pair including first and second traces;
    first and second ground traces routed between the first and second traces of the differential pair; and
    a ground via located between the first and second ground traces,
        wherein the first ground trace includes a first length on a first side of the ground via and the second ground trace includes a second length on a second side of the ground via, wherein the first length is longer than the second length,
        wherein the first and second ground traces and the ground via combine to create a common mode signal filter, the common mode signal filter to reset a skew of the differential pair.

2. The printed circuit board of claim 1, wherein each of the first and second ground traces is a triangle shape on both sides of the ground via.

3. The printed circuit board of claim 2, wherein the triangle shape gradually increases an impedance of the first and second ground traces.

4. The printed circuit board of claim 1, wherein the first and second traces substantially follow the shape of the first and second ground traces and ground via.

5. The printed circuit board of claim 1, wherein each of the first and second ground traces is a rectangle shape on both sides of the ground via.

6. The printed circuit board of claim 1, wherein the ground via connects the first and second ground traces of a ground plane layer of the printed circuit board.

7. The printed circuit board of claim 1, wherein the first and second ground traces are routed along a line of symmetry between the first and second traces of the differential pair.

8. The printed circuit board of claim 1, wherein a center frequency of the common mode filter is set based on the first and second lengths of the respective first and second ground traces.

9. A printed circuit board of an information handling system, the printed circuit board comprising:
 a first differential pair including first and second traces;
 a first common mode filter located between the first and second traces, the first common mode filter includes:
  a first and second ground traces routed between the first and second traces of the first differential pair; and
  a first ground via located between the first and second ground traces, wherein the first ground trace includes a first length on a first side of the ground via and the second ground trace includes a second length on a second side of the ground via, wherein the first length is longer than the second length, wherein the first common mode signal filter to reset a first skew of the first differential pair;
 a second differential pair including third and fourth traces; and
 a second common mode filter located between the third and fourth traces, the second common mode filter includes:
  a third and fourth ground traces routed between the third and fourth traces of the second differential pair; and
  a second ground via located between the third and fourth ground traces, wherein the second common mode signal filter to reset a second skew of the second differential pair, wherein the first and second common mode filters are offset from each other.

10. The printed circuit board of claim 9, wherein each of the first and second ground traces is a triangle shape on both sides of the ground via.

11. The printed circuit board of claim 10, wherein the triangle shape gradually increases an impedance of the first and second ground traces.

12. The printed circuit board of claim 9, wherein the ground via connects the first and second ground traces of a ground plane layer of the printed circuit board.

13. The printed circuit board of claim 9, wherein the first and second ground traces is routed along a line of symmetry between the first and second traces of the differential pair.

14. The printed circuit board of claim 9, wherein a center frequency of the common mode filter is set based on the first and second lengths of the respective first and second ground traces.

15. A method comprising:
 routing a first and second ground traces within a printed circuit board of an information handling system;
 connecting the first and second ground traces to a ground layer by a ground via located between a length of the first and second ground traces wherein the first ground trace includes a first length on a first side of the ground via and the second ground trace includes a second length on a second side of the ground via, wherein the first length is longer than the second length;
 routing a first trace of a differential pair on a first side of the first and second ground traces and the ground via; and
 routing a second trace of the differential pair on a second side of the first and second ground traces and the ground via.

16. The method of claim 15, wherein the first and second ground traces and the ground via combine to create a common mode filter.

17. The method of claim 15, wherein a center frequency of the common mode filter is set based on the first and second lengths of the respective first and second ground traces.

* * * * *